United States Patent
Chiu et al.

(10) Patent No.: US 6,807,972 B2
(45) Date of Patent: Oct. 26, 2004

(54) GUTTER AND SPLASH-GUARD FOR PROTECTING A WAFER DURING TRANSFER FROM A SINGLE WAFER CLEANING CHAMBER

(75) Inventors: Ho-Man Rodney Chiu, Mountain View, CA (US); Eugene Smargiassi, San Jose, CA (US); Steven Verhaverbeke, San Francisco, CA (US); Brian H. Burrows, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 122 days.

(21) Appl. No.: 10/113,495

(22) Filed: Mar. 29, 2002

(65) Prior Publication Data

US 2003/0183250 A1 Oct. 2, 2003

(51) Int. Cl.⁷ .................................................. B08B 3/02
(52) U.S. Cl. ................... 134/94.1; 134/103.2; 134/182; 134/902
(58) Field of Search ................................ 134/182, 183, 134/902, 94.1, 95.3, 103.2

(56) References Cited

U.S. PATENT DOCUMENTS

| 3,950,184 | A | * | 4/1976 | Adams et al. |
| 4,674,521 | A | * | 6/1987 | Paulfus |
| 4,788,994 | A | * | 12/1988 | Shinbara |
| 4,855,775 | A | * | 8/1989 | Matsuoka |
| 5,871,584 | A | * | 2/1999 | Tateyama et al. |
| 6,059,891 | A | * | 5/2000 | Kubota et al. |
| 6,165,267 | A | * | 12/2000 | Torczynski |
| 6,168,660 | B1 | * | 1/2001 | Hayes et al. |
| 6,210,481 | B1 | * | 4/2001 | Sakai et al. |
| 6,241,402 | B1 | * | 6/2001 | Sakamoto et al. |
| 6,332,723 | B1 | * | 12/2001 | Matsuyama et al. |
| 6,391,110 | B1 | * | 5/2002 | Satou et al. |
| 6,415,804 | B1 | * | 7/2002 | Pascal et al. |
| 6,494,220 | B1 | * | 12/2002 | Matsuda et al. |
| 6,533,864 | B1 | * | 3/2003 | Matsuyama et al. |
| 6,536,454 | B2 | * | 3/2003 | Lindner |
| 6,612,315 | B2 | * | 9/2003 | Pascal et al. |
| 6,616,762 | B2 | * | 9/2003 | Inada et al. |

FOREIGN PATENT DOCUMENTS

| JP | 9-275089 | * | 10/1997 |
| JP | 10-335297 | * | 12/1998 |
| JP | 11-97398 | * | 4/1999 |
| JP | 11-162924 | * | 6/1999 |
| JP | 11-285601 | * | 10/1999 |

* cited by examiner

Primary Examiner—Frankie L. Stinson
(74) Attorney, Agent, or Firm—Blakely Sokoloff Taylor & Zafman

(57) ABSTRACT

A single wafer cleaning chamber that includes a rotatable bracket that can place a wafer beneath an upper end of a catch cup during a wafer cleaning process, a gutter positioned above a wafer transfer slit; where the catch cup can mate with the gutter to create a gap, and with the upper end of the catch cup positioned at a height equal to or higher than the gutter.

12 Claims, 13 Drawing Sheets

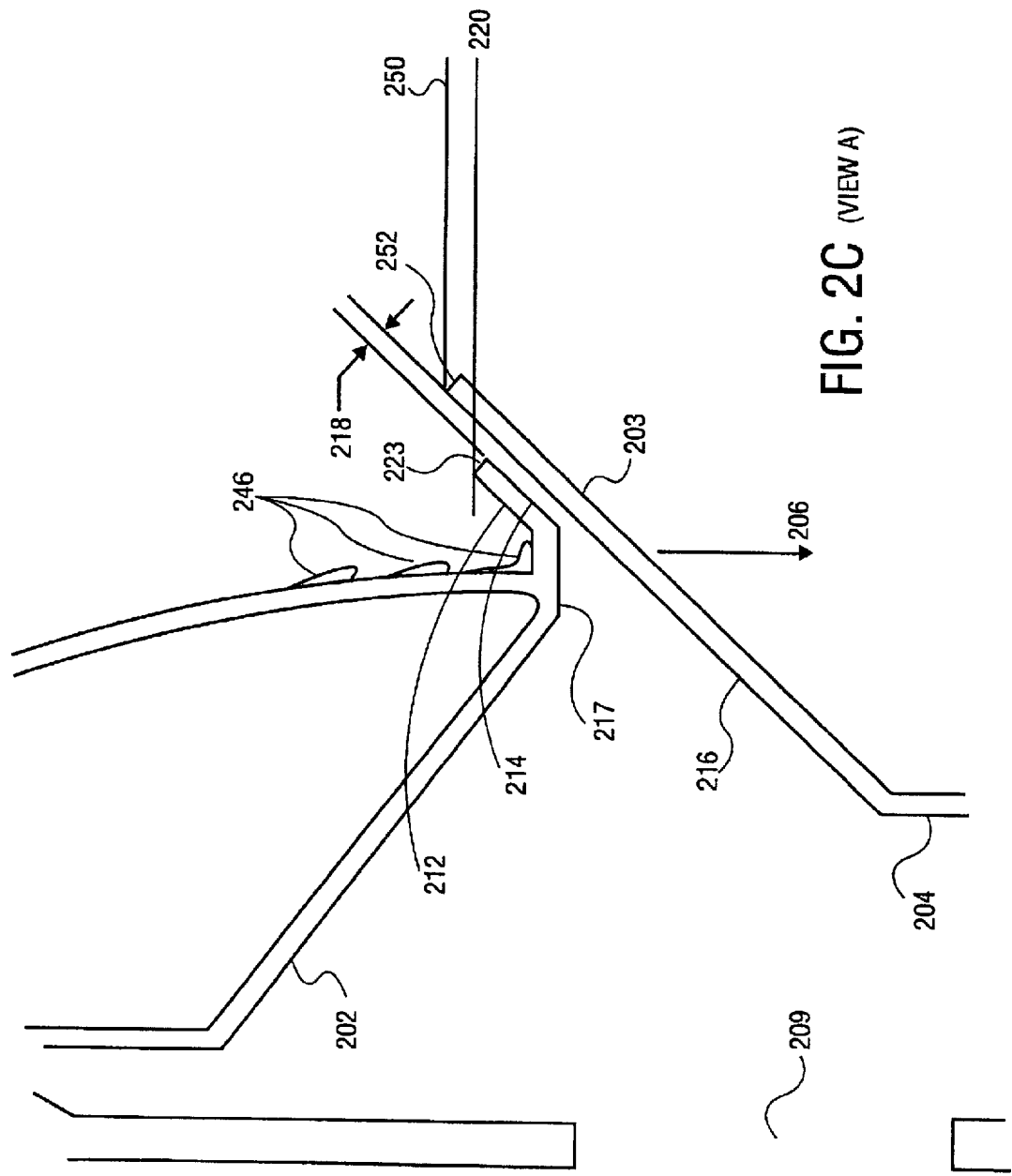
FIG. 2C (VIEW A)

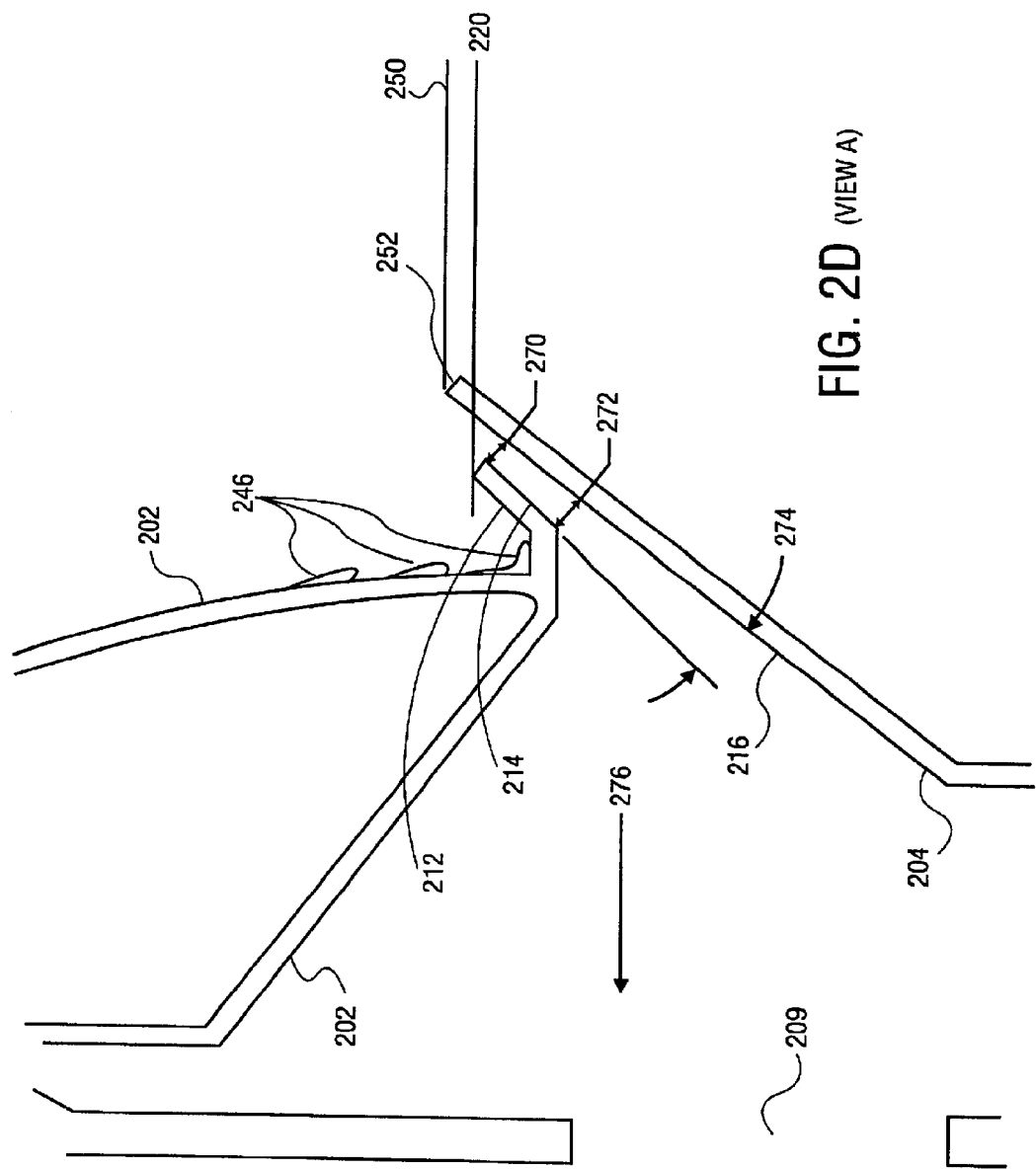
FIG. 2D (VIEW A)

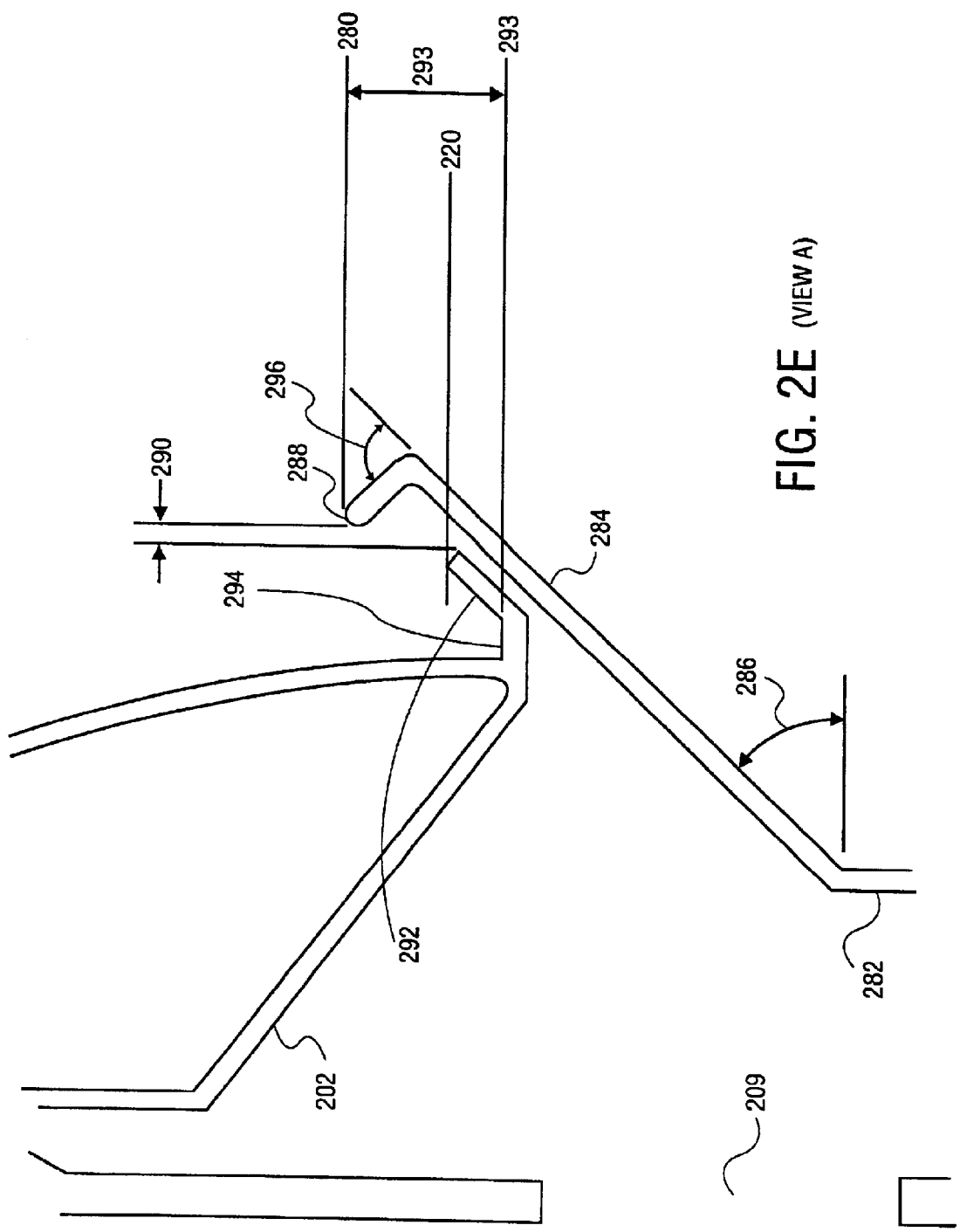
FIG. 2E (VIEW A)

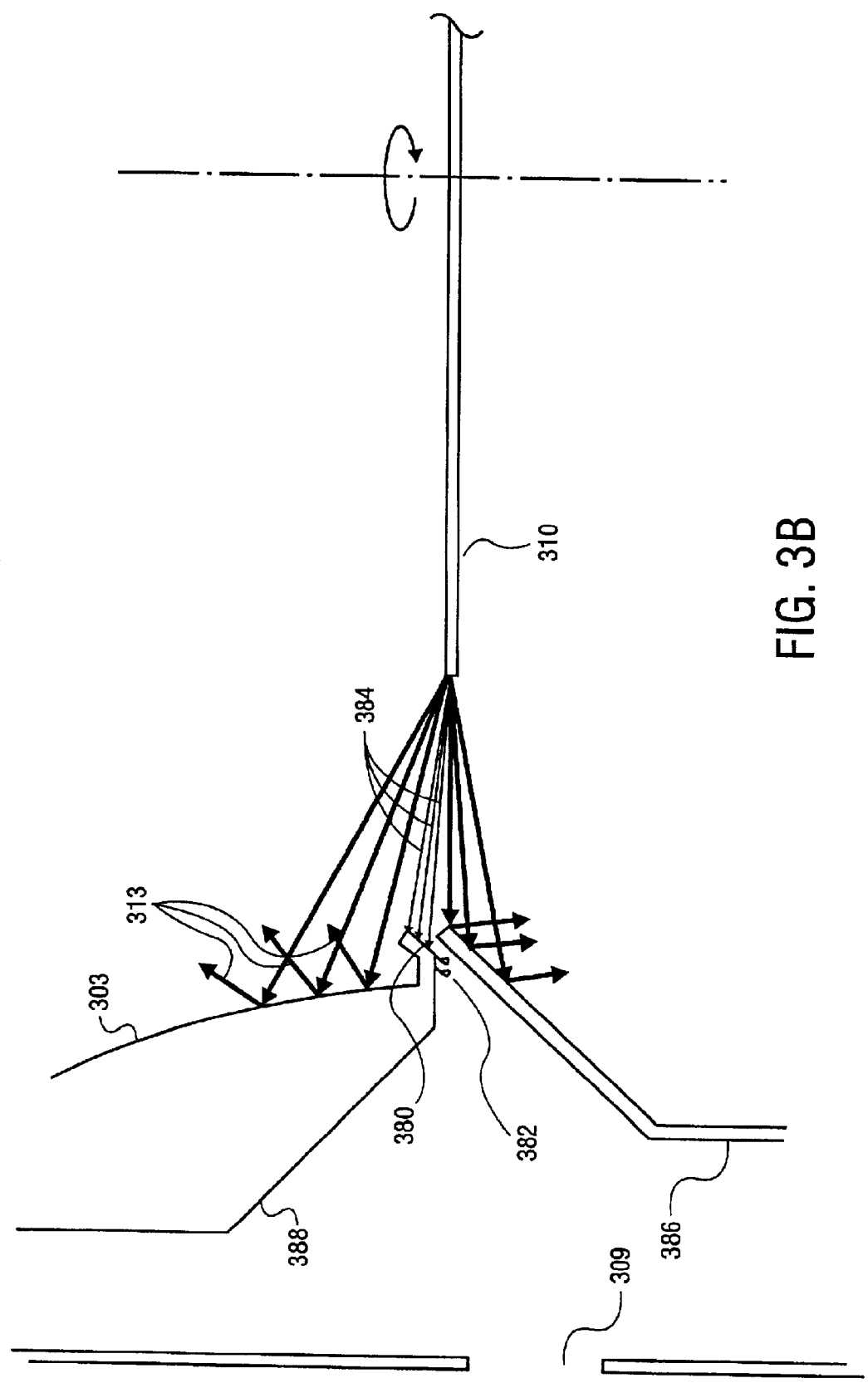

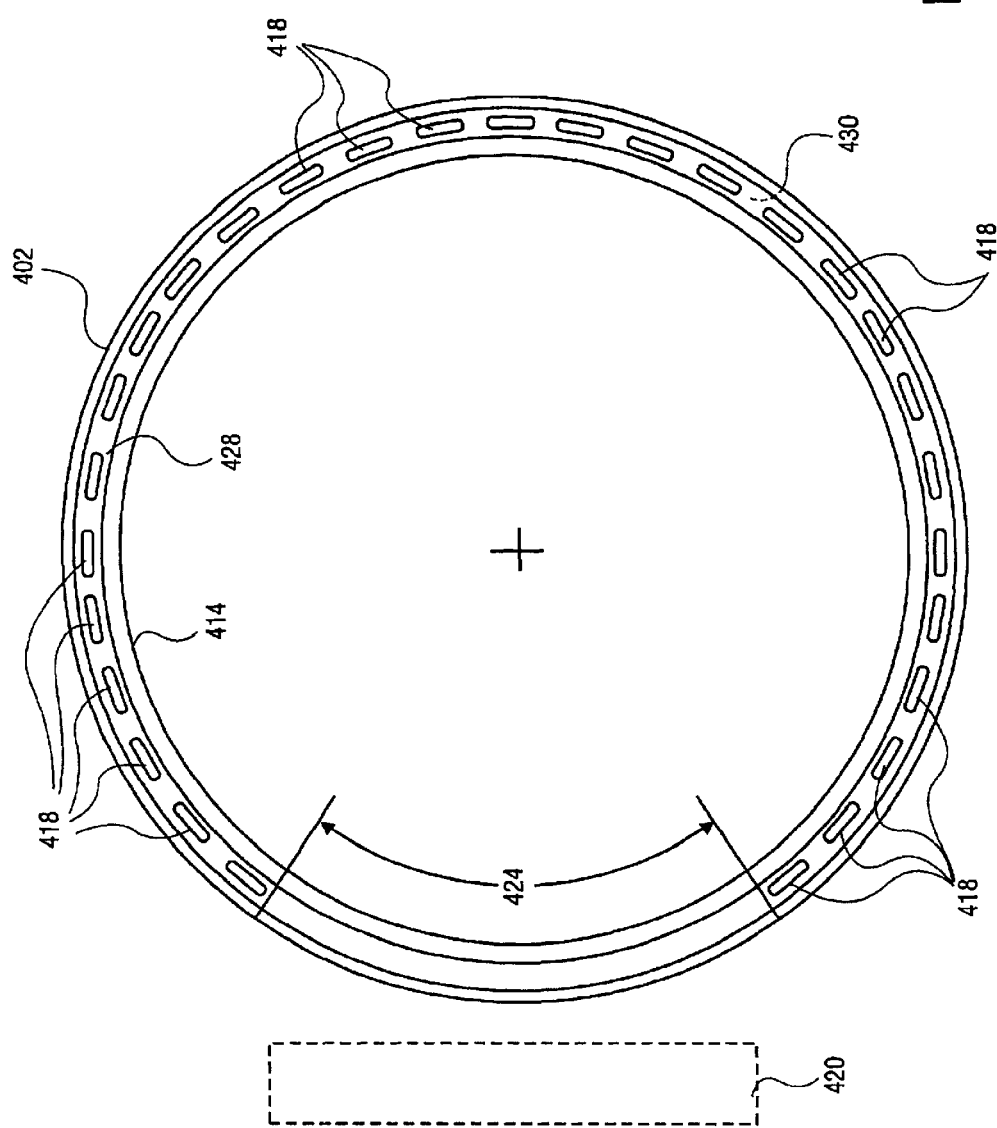

GUTTER AND SPLASH-GUARD FOR PROTECTING A WAFER DURING TRANSFER FROM A SINGLE WAFER CLEANING CHAMBER

FIELD OF THE INVENTION

The present invention pertains in general to wafer processing apparatus and in particular to a single wafer cleaning chamber.

BACKGROUND OF THE INVENTION

The cleaning and preparation of the silicone surface of a wafer for further processing is one of the most important tasks in the semiconductor industry. The main goal is to remove the contaminants from the wafer surface and to control chemically grown oxide on the wafer surface. Modern integrated electronics would not be possible without the development of technologies for cleaning and contamination control, and further reduction of the contamination level of the silicone wafer is mandatory for the further reduction of the IC element dimensions. Wafer cleaning is the most frequently repeated step in IC manufacturing and is one of the most important segments in the semiconductor-equipment business, and it looks as if it will remain that way for some time. Each time device-feature sizes shrink or new tools and materials enter the fabrication process, the task of cleaning gets more complicated.

Today, at 0.18-micron design rules, 80 out of ~400 total steps will be cleaning. While the number of cleans increases, the requirement levels are also increasing for impurity concentrations, particle size and quantity, water and chemical usage and the amount of surface roughness for critical gate cleans. Not only is wafer cleaning needed now before each new process sequence, but additional steps are often required to clean up the fabrication process tools after a production run.

Traditionally, cleaning has been concentrated in the front end of the line (FEOL) where active devices are exposed and more detailed cleans required primary challenge in FEOL cleans is the continuous reduction in the defect levels. As a rule, a "killer defect" is less than half the size of the device line width. For example, at 0.25 $\mu$m geometries, cleans must remove particles smaller than 0.12 $\mu$m and at 0.18 $\mu$m, 0.09 $\mu$m particles.

Most cleaning methods can be loosely divided into two big groups: wet and dry methods. Liquid chemical cleaning processes are generally referred to as wet cleaning. They rely on combination of solvents, acids and water to spray, scrub, etch and dissolve contaminants from wafer surface. Dry cleaning processes use gas phase chemistry, and rely on chemical reactions required for wafer cleaning, as well as other techniques such as laser, aerosols and ozonated chemistries. Generally, dry cleaning technologies use less chemicals and are less hazardous for the environment but usually do not perform as well as wet methods, especially for particle removal.

For wet-chemical cleaning methods, the RCA clean, developed in 1965 by RCA, still forms the basis for most front-end wet cleans. A typical RCA-type cleaning sequence starts with a sulphuric-peroxide step ($H_2SO_4/H_2O_2$) followed by a dip in diluted HF (hydrofluoric acid). Next, an SC1 (Standard Clean step 1) uses a solution of $NH_4OH/H_2O_2/H_2O$ to remove particles, followed by an SC2 (Standard Clean step 2) using a solution of $HCl/H_2O_2/H_2O$ to remove metals.

Despite increasingly stringent process demands and orders-of-magnitude improvements in analytical techniques, in the cleanliness of chemicals, and through the use of highly pure water, such as deionized (DI) water, the basic cleaning recipes have remained unchanged since the first introduction of this cleaning technology. Since environmental concerns and cost-effectiveness were not a major issue 30 years ago, the RCA cleaning procedure is far from optimal in these respects. Recently much research effort has been directed toward understanding the cleaning chemistries and techniques.

Important chemical savings can be obtained in an RCA-type cleaning sequence by using diluted chemistries for both the SC1 and SC2 mixtures. In the SC2 mixture, the $H_2O_2$ can be left out completely since it has been shown that strongly diluted HCl mixtures are as effective in the removal of metals as the standard SC2 solution. An added benefit of using diluted HCl is that at low HCl concentrations particles do not deposit, as has also been observed experimentally. This is because the isoelectric point for silicon and silicon dioxide is between pH 2 and 2.5. At a pH above the isoelectric point, the wafer surface has a net negative charge, while below it the wafer surface has a net positive charge. For most particles in liquid solutions at pH values greater than 2–2.5, an electrostatic repulsion barrier between the particles in the solution and the surface is formed. This barrier impedes particle deposition from the solution onto the wafer surface during immersion. Below pH 2, the wafer surface is positively charged, while many of the particles remain negatively charged, removing the repulsion barrier and resulting in particle deposition while the wafers are submerged.

To further lower the chemical consumption during wet wafer cleaning, some simplified cleaning strategies can be used, such as in a first step, organic contamination can be removed and a thin chemical oxide grown. In a second step, the chemical oxide is removed, simultaneously removing particle and metal contamination. An additional third step can be added before final rinsing and drying to make the Si surface hydrophilic to allow for easier drying without the generation of drying spots or "watermarks."

FIGS. 1A & 1B are illustrations of a single wafer cleaning chamber. FIG. 1A is an illustration of a wafer top loaded into the process chamber. FIG. 1B is an illustration of the top loaded wafer during processing within the single wafer cleaning chamber. An air filter can exist at the top of the process chamber and positioned beneath the air filter can be a wafer transfer slit. A rotatable wafer holding bracket can be extended to receive or release a wafer from a robot blade (not shown). The wafer must then be lowered by the bracket to a position below the air filter that is sufficient to avoid liquid spray from reaching the air filter. The wafer must also be positioned below a source for cleaning solutions onto the wafer such as a spray nozzle.

The RCA clean sequence developed in the 1960s still is used widely in semiconductor manufacturing as a critical clean for the removal of organic, metallic and particulate contamination on wafer surfaces prior to oxide growth operations. The typical sequence starts with a sulphuric-peroxide solution to remove heavy organic removal, followed by dip in the HF. SC-1 removes particles and SC-2 removes metal contaminations. High pH SC-1 is an effective particulate removal chemistry, aided by the high negative zeta potential of both silicon and oxide in this pH range. SC-2 is effective at removing metallic contamination with a pH low enough to ensure good metal oxide solubility and with the chloride ion acting as a complexing agent.

The composition and order of steps can vary but all wafers are rinsed in pure wafer after each chemical immersion. The last few years have brought some changes such as with the use of megasonic energy to increase particle removal efficiency, but the basic cleaning philosophy used in most fabrication processes is still based on the original RCA process.

Megasonic agitation is the most widely used approach to adding energy (at about 800 kHz or more) to the wet cleaning process. The physics behind how particles are removed, however, is not well understood. A combination of an induced flow in the cleaning solution (called acoustic streaming), cavitation, the level of dissolved gases and oscillatory effects are all thought to contribute to particle removal performance.

Currently, the industry can remove a wafer from a batch or single wafer cleaning chamber by elevating the wafer(s) to the top of the chamber for removal and subsequent addition of new wafer(s) to be cleaned. Batch processing can place contaminants back onto the wafer during wafer removal from the cleaning solution. With the addition of new apparatus to the single wafer cleaning chamber to increase the speed of the cleaning process, translating the wafer(s) to the top of the cleaning chamber has become problematic. The time needed to translate the wafer(s) and the necessity of providing for such translation around the increasing complexity of apparatus being added within the process chamber, such as to transmit megasonic energy, are just a few of the problems associated with wafer transfer from the top of the process chamber.

SUMMARY OF THE INVENTION

The present invention provides an apparatus and method for improved wafer cleaning in a single wafer cleaning chamber. A wafer can be transferred in and out of the single wafer cleaning chamber at mid-chamber level. An upper arm that is a circular ring can be placed above the level of wafer transfer. The upper arm can have a gutter located at the bottom end to trap liquids used in the cleaning process that flow down the chamber interior walls. The gutter can catch these liquids that otherwise might fall onto the wafer during a transfer operation.

The gutter can mate with an angled surface of a catch cup. The angled surface can act as a splash-guard to minimize liquid spray, from a rotating wafer, from reaching one or more surfaces on the gutter from which the liquid can flow down onto the wafer during transfer. An aerodynamically shaped upper arm can maintain smooth air flow around the gutter and onto the wafer is described where the shape of the upper arm and the angled surface of the catch cup can also reduce splash-back of the spray back onto the rotating wafer.

BRIEF DESCRIPTION OF THE DRAWINGS

The present invention is illustrated by way of example and not limitation in the figures of the accompanying drawings, in which like references indicate similar elements and in which:

FIG. 2C is an illustration of one embodiment of a gutter surface mating with a catch cup surface where the two surfaces are parallel to each other.

FIG. 2D is an illustration of another embodiment of the gutter surface mating with the catch cup surface where the two surfaces are angled relative to each other.

FIG. 2E is an illustration of yet another alternate embodiment for the gutter mated with an extended height catch cup.

FIG. 3B is an illustration of liquid spray from a rotating wafer reaching a catch angled surface that is positioned lower than the gutter.

FIG. 4B is an illustration of the one embodiment of the upper arm as a top down view showing gutter drain locations.

DETAILED DESCRIPTION

A method and apparatus is disclosed for restricting liquids from failing onto a wafer during a mid-level wafer transfer from a single wafer process chamber (process chamber). An upper ring can be positioned in the interior of the process chamber, which has a gutter. The gutter, located above a wafer transfer slit, can have a lip to capture process liquids that may flow down the walls of the process chamber. The gutter can direct the process liquids to drain slots in the gutter that are located away from the wafer transfer slit area. A further aspect of the present invention is to have a catch cup act as a splash-guard to the gutter. The catch cup can shield exterior surfaces of the gutter lip from direct liquid spray coming off a rotating wafer. Deflecting process liquids with the catch cup can limit the process liquids from contacting the exposed surfaces of the gutter lip to later fall onto the wafer during the wafer transfer. In addition, when rotating the wafer to remove liquids, angled and/or curved surfaces in the upper ring and the catch cup can limit the amount of liquid spray bouncing back onto the rotating wafer.

For purposes of discussing the invention, it is to be understood that various terms are used by those knowledgeable in the art to describe apparatus, techniques, and approaches. In the following description, for purposes of explanation, numerous specific details are set forth in order to provide a thorough understanding of the present invention. It will be evident, however, to one skilled in the art that the present invention may be practiced without these specific details. In some instances, well-known structures and devices are shown in gross form rather than in detail in order to avoid obscuring the present invention. These embodiments are described in sufficient detail to enable those skilled in the art to practice the invention, and it is to be understood that other embodiments may be utilized and that logical, mechanical, electrical, and other changes may be made without departing from the scope of the present invention.

One form of a single wafer processing chamber can be a single wafer cleaning chamber (cleaning chamber). The single wafer cleaning chamber can be used to clean wafers before and after a variety of wafer processes, such as, for example, deposition of a metallized film, photoresist patterning, or Rapid Thermal Processes (RTP can be used for such processes as wafer annealing, doping, and oxide growth). The cleaning chamber can use such chemical cleaning methods as the RCA cleaning process. After an HF etch performed as part of the cleaning process, there are usually particles in the rinse water and there is dissolved silica. It is important to remove those particles and dissolved silica from the wafer surface. In one embodiment of a single wafer cleaning chamber, the particles can be removed by immersing the wafer in a cleaning liquid while contacting the wafer with megasonic sound waves.

Figure 1A:
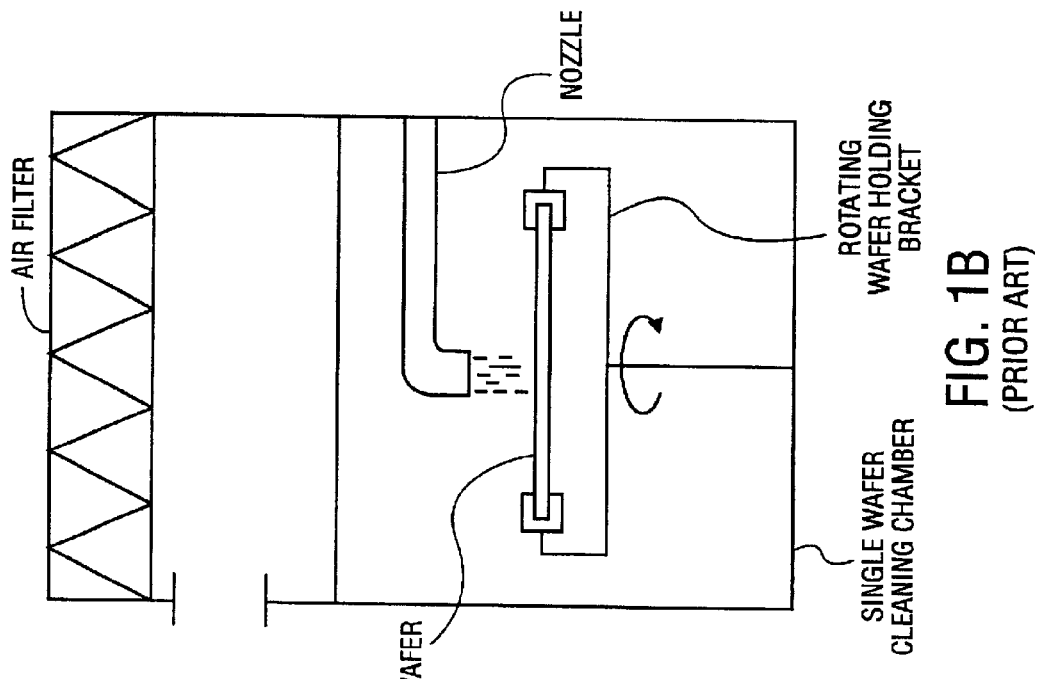
FIG. 1A is an illustration of a wafer transfer into a single wafer cleaning chamber.
Figure 1B:
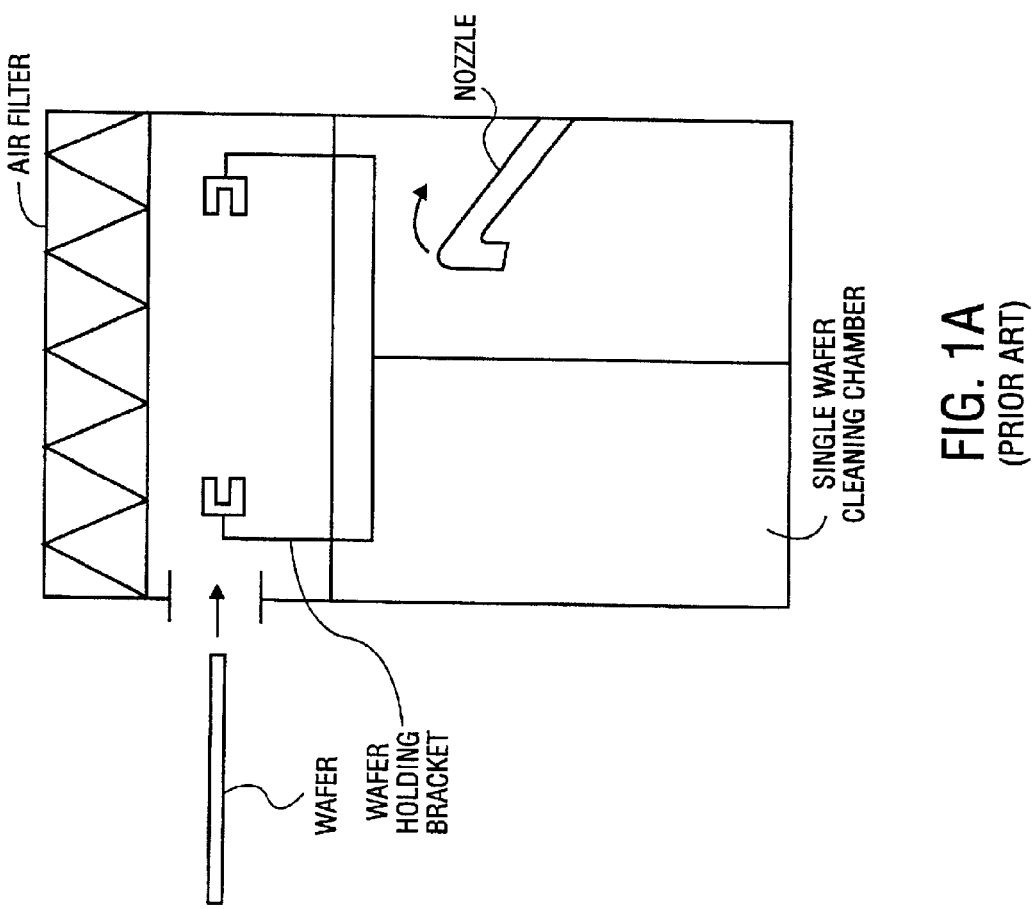
FIG. 1B is an illustration of wafer processing within the single wafer cleaning chamber.
Figure 2A:
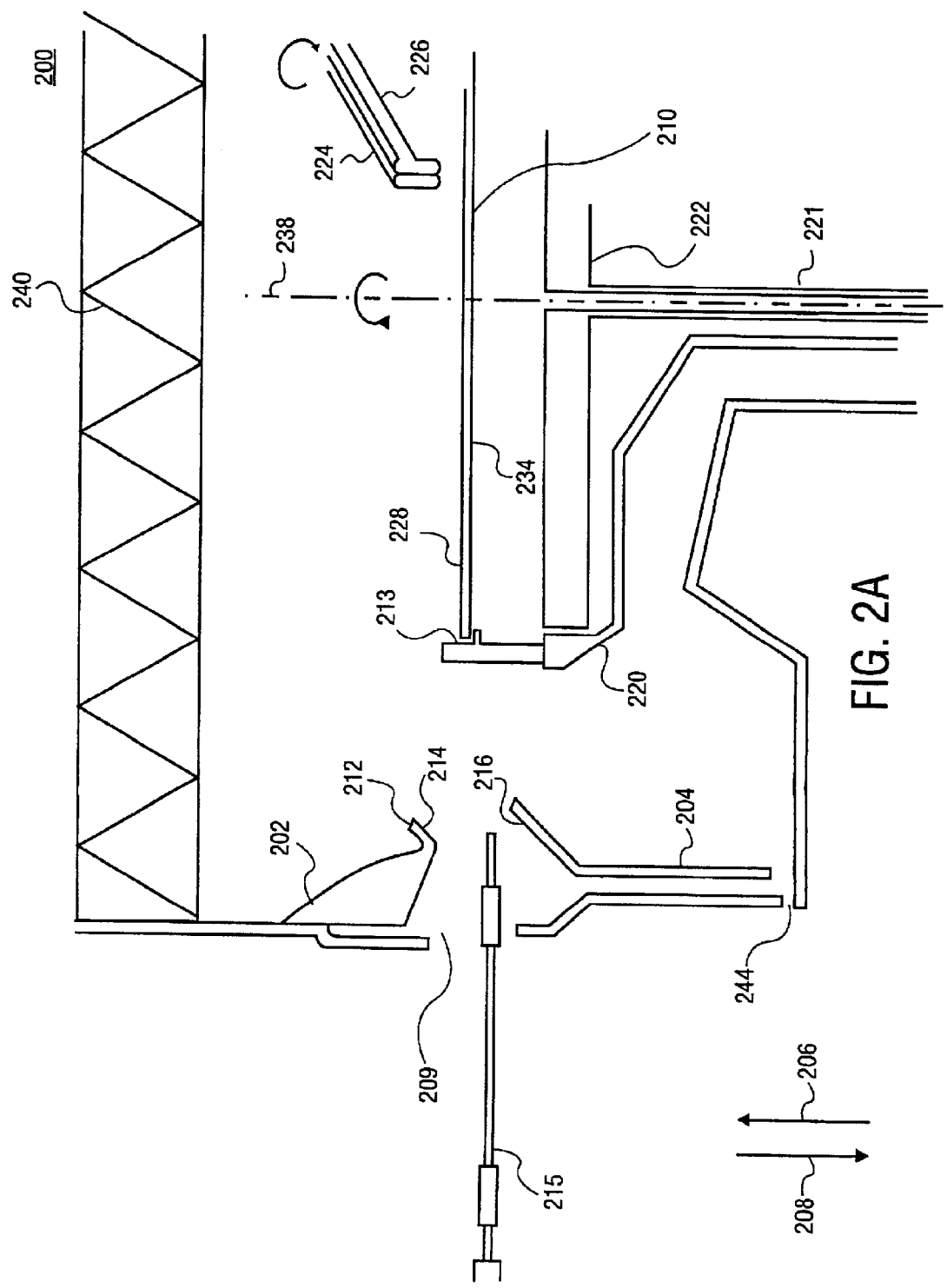
FIG. 2A is an illustration of one embodiment of a single wafer cleaning chamber during a wafer transfer.
Figure 2B:
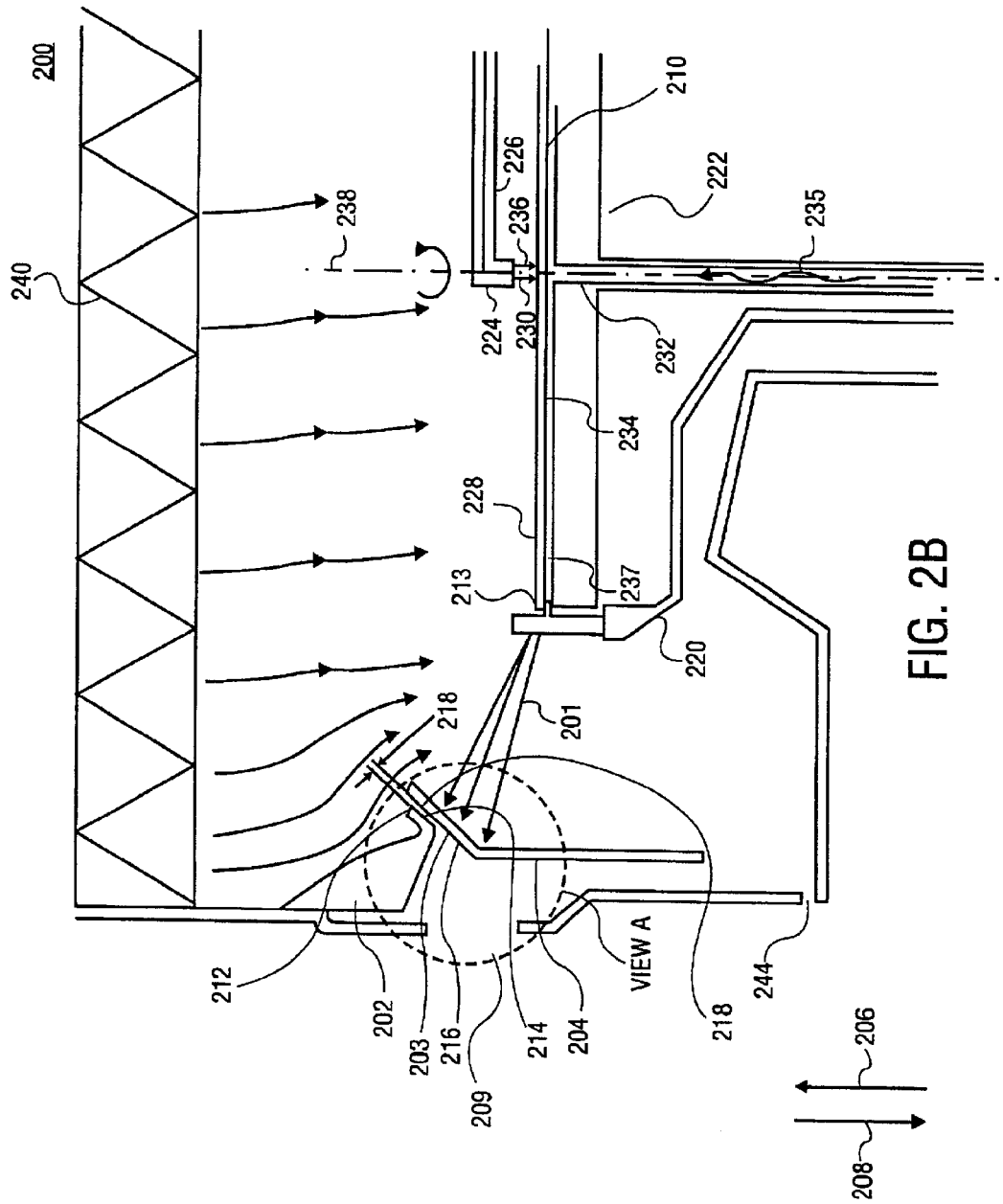
FIG. 2B is an illustration of one embodiment of the single wafer cleaning chamber during processing.

FIGS. 2A & 2B show a mid-level transfer chamber, i.e. the wafer is transferred in and out of the cleaning chamber through a wafer transfer slit that is positioned at a level approximately mid-way between the cleaning chamber top and bottom ends. Mid-level wafer transfer designs can shorten the up and down travel distance between the wafer process and wafer transfer positions as opposed to removing the wafer from the top of the cleaning chamber. The shorter distance can simplify the mechanical mechanisms needed to translate the wafer and the wafer holding bracket around the increasing complexities of the interior of the cleaning chamber, such as liquid transfer tubes and transducer plates.

FIG. 2A is an illustration of one embodiment of the single wafer cleaning chamber in a position for wafer transfer. As shown in FIG. 2A, the wafer 228 can be elevated 206 by a wafer holding bracket (bracket) 220 to a height that is level with a wafer transfer slit (slit) 209 for removing the wafer 210 from the cleaning chamber 200. The slit 209 is disposed above the wafer process position so that when the wafer 210 is raised to the slit 209 level for transfer, clearance is created beneath the wafer 210 to position the robot arm 215. The bracket 220 can next be lowered slightly, releasing the wafer to the robot arm 215.

A catch cup 204 can have an angled section 203 such that when raised 206 in the processing position, the catch cup 204 can shield exposed surfaces 214 of the gutter 212 from spray from the wafer 210 during processing. The catch cup 204 can be translatable 206 and 208 such that when lowered 208, access to the wafer 210 by the robot arm (215) can occur. Within the cleaning chamber 200 can be an upper ring 202, fixed in-place above the slit 209. An upward angled lip 214 can exist at the bottom end of the upper ring 202 to function as the gutter 212. Nozzles 224 and 226 that can flow liquids and gasses onto the wafer 210 during processing can also be translated, such as by a rotation, to provide clearance for the wafer 210 during transfer. An air filter 240 can be placed at the top of the cleaning chamber 200 to clean the air before the air flows down onto the wafer 210. Drains 244 can be positioned at locations within the cleaning chamber 200 to remove liquids.

FIG. 2B is an illustration of the one embodiment of the single wafer cleaning chamber in a process position. Prior to processing, the bracket 220 can position the wafer 210 a few millimeters above the transducer plate 222 for transmitting megasonic energy into the wafer 210. The catch cup 204 can also be raised 206 for wafer processing, where an inboard (exposed) surface 214 of the of the gutter 212 can mate with an angled outboard surface 216 of the catch cup 204 to create a gap 218. The air filter 240 can flow forced air 242 down onto the wafer 210 throughout the cleaning process where the forced air 242 can flow around the upper ring 202, across the gutter 212 and catch cup 204 to contact the wafer 210 before exhausting at the bottom of the process chamber 200.

Within the process chamber 200, process gasses and liquids can be applied to the wafer 210 top 228 and bottom 234 surfaces. From the top, two nozzles 224 and 226 can be positioned to direct flows of a gas, vapor, and/or liquid onto the wafer top surface 228 where the nozzles 224 and 226 can initially be positioned approximately at the wafer center 238. The two nozzles 224 and 226 can then be translated to direct the flows toward the outer edge 213 of the wafer 210. A liquid can flow through a feed port 232 in the transducer plate 222 to can fill a gap 237 between the wafer 210 and the transducer plate 222. This liquid can carry megasonic energy to the wafer and flow of the liquid 235 can also rinse the wafer 210.

To clean a wafer within the cleaning chamber, several process cycles can occur. A cleaning cycle can apply forced clean air and the cleaning solutions to the top wafer surface 228 and cleaning solutions to the bottom surface 234 of the wafer 210 while the wafer 210 is rotating and receiving megasonic energy. Next, the flow of cleaning solutions can be stopped and the wafer rotation rate increased to spin off the solutions. A rinse cycle can follow where DI water, with or without a gas or vapor, can be used that is followed by a drying cycle where the wafer 210 is rotated at a high rate such as over 1000 rpm.

During the cleaning cycle, the first nozzle 224 can flow cleaning solutions such as used in an RCA type cleaning process, to contact the wafer 210 at a first location 230 while the second nozzle 226 may flow a gas or a vapor or the second nozzle 226 can be turned off. When used, flow from the second nozzle 226 can be applied to the wafer surface 228 at a position 236 that is inboard (i.e. closer to the wafer center of rotation 238) of the first location 230. Next, both the first nozzle 224, flowing the cleaning solution, and the second nozzle 226, flowing IPA vapor or air, can be translated such as linearly or by pivoting (shown) across the rotating wafer 210 from the wafer center 238 to the wafer outer edge 213. Translation of these two nozzles 224 and 226 while flowing cleaning solution and IPA vapor onto the wafer, can improve the efficiency of liquid removal off the wafer 210. When the cleaning solutions have completed their action on the wafer 210, the megasonic energy may be turned off and the wafer rpm increased to spin off any remaining liquids.

Next follows the rinse cycle, where the first nozzle 224 can flow DI water and the second nozzle 226 can flow a gas or a vapor onto the wafer top surface 228. The gas/vapor from the second nozzle 226 can again aid in the removal of liquids, such as, for example, remaining RCA cleaning solutions and deionized (DI) water applied by the first nozzle 224. A fluid 235, such as, for example, DI water, can pass through the feed-port 232 in the transducer plate 222 to flow between the wafer bottom surface 234 and the transducer plate 222. During the rinse cycle, megasonic energy is once again applied to the wafer, and where the wafer rotation rate can be approximately 50–200 rpm. At the end of the rinse cycle megasonic energy and the flow of fluids can be stopped. The wafer rotation can then be increased to a rate that is greater than 1000 rpm to assist in liquid removal from the wafer surfaces 228 and 234.

After each cleaning and/or rinse cycle, the wafer 210 can be rotated at a high rpm to spin off the liquids as a spray. This spray can strike the interior chamber walls and flow down into drains 244 located in the lower portion of the cleaning chamber 200. The gutter 212 can be positioned to catch these liquids before the liquids can fall onto the wafer 210 during the mid-level wafer transfer. The gutter 212 can re-direct the liquids away from the wafer transfer area, i.e. away from the area around the wafer transfer slit 209. Once the liquids have been directed away from the wafer transfer area by the gutter 212 drains in the gutter (see FIGS. 4A & 4B below) can allow the liquids to continue to flow down to the bottom of the cleaning chamber 200 to be collected for removal.

FIG. 2C is an illustration of one embodiment of a gutter mated with the catch cup for wafer processing. FIG. 2C is an enlargement of View A from FIG. 2B and shows the catch cup 204 in the processing position where the catch cup 204 is raised to mate with the gutter 212 in the upper ring 202. The gutter 212 is formed at the lower base of the upper ring 202 with an extended lip. The gutter 212 is used to collect process liquids 246 traveling down the upper ring 202 where such process liquids 246 were sprayed onto the upper ring 202 surfaces by a rotating wafer (see FIGS. 3A–3C below).

The gutter inboard (exposed) surface 214 can be a flat angled surface 214 and when mated with the catch cup outboard surface 216 can form a gap 218 having parallel surfaces 214 and 216. The height 220 of the gutter 212 upper end 223 can be approximately the same or less than the height 250 of the upper end 252 of the catch cup 204. With the height 250 of the catch cup 204 equal to or greater than the height 220 of the gutter 212, the gutter 212 can be shielded from direct spray from the rotating wafer (FIG. 2A above). The gap 218 formed can be approximately 5 mm but where a gap in the range of approximately 1–8 mm can also be used. A gap 218 is used instead of forming a seal such as by contact between the two surfaces 214 and 216, for such contact could still allow liquids to form around the end 252 of the catch cup 204 to later flow onto the gutter inboard surface 214 when the catch cup 204 is lowered 206.

The angled section 203 of the catch cup 204, when positioned in the process position, places the surface 216 near the gutter 212 where the catch cup 204 can act as a splatter guard and deflect spray 201 (FIG. 2B) from the rotating wafer 210 away from the exposed gutter surface 214. By deflecting the spray from the wafer 210, here cleaning and rinse solutions, liquids can be kept away from the gutter inboard surface 214. Liquids flowing to this gutter inboard surface 214 could potentially travel down to collect on a bottom surface 217 of the upper ring 202 to later fall onto a cleaned wafer (not shown) as it transfers out of the cleaning chamber.

FIG. 2D is an illustration of an alternate embodiment for View A of the gutter mated with the catch cup when processing the wafer. As shown in FIG. 2D, the height 250 of the catch cup 204 remains equal to or greater than the height 220 of the gutter 212, however, the surfaces 214 and 216 making up the separation between the gutter 212 and the catch cup 202 are not parallel. In this embodiment, the gap is smaller at the inboard side 270 than at the outboard side 272. This angled relationship 274 of the two surfaces 214 and 216 will "angle away" the critical gutter surface 214 from direct wafer spray, which can make contacting the gutter inboard surface 260 by wafer spray (see FIGS. 3A and 3B below) difficult. The angle 274 can be in the range of approximately 0–45 degrees and with the angle 274 opening in the outboard direction 276.

FIG. 2E is an illustration of another alternate embodiment for View A of the gutter mated with the catch cup having an extended height. As shown in FIG. 2E, the height 280 of the catch cup 282 can be greater than the height 220 of the gutter 212. The catch cup 282 can have a surface 284 angled 45 degrees 286 from vertical. The catch cup 282 can have an upper end 288 that can be angled 90 degrees 296 from the 45 degree surface 284. The upper end 288 can be positioned inboard to provide clearance 290 from the gutter 292 during translation of the catch cup 282. When the catch cup 282 is raised in the process position, as shown, the catch cup upper end 288 can extend approximately in the range of 5–14 mm (293) above the floor 294 of the gutter 292.

Figure 3A:
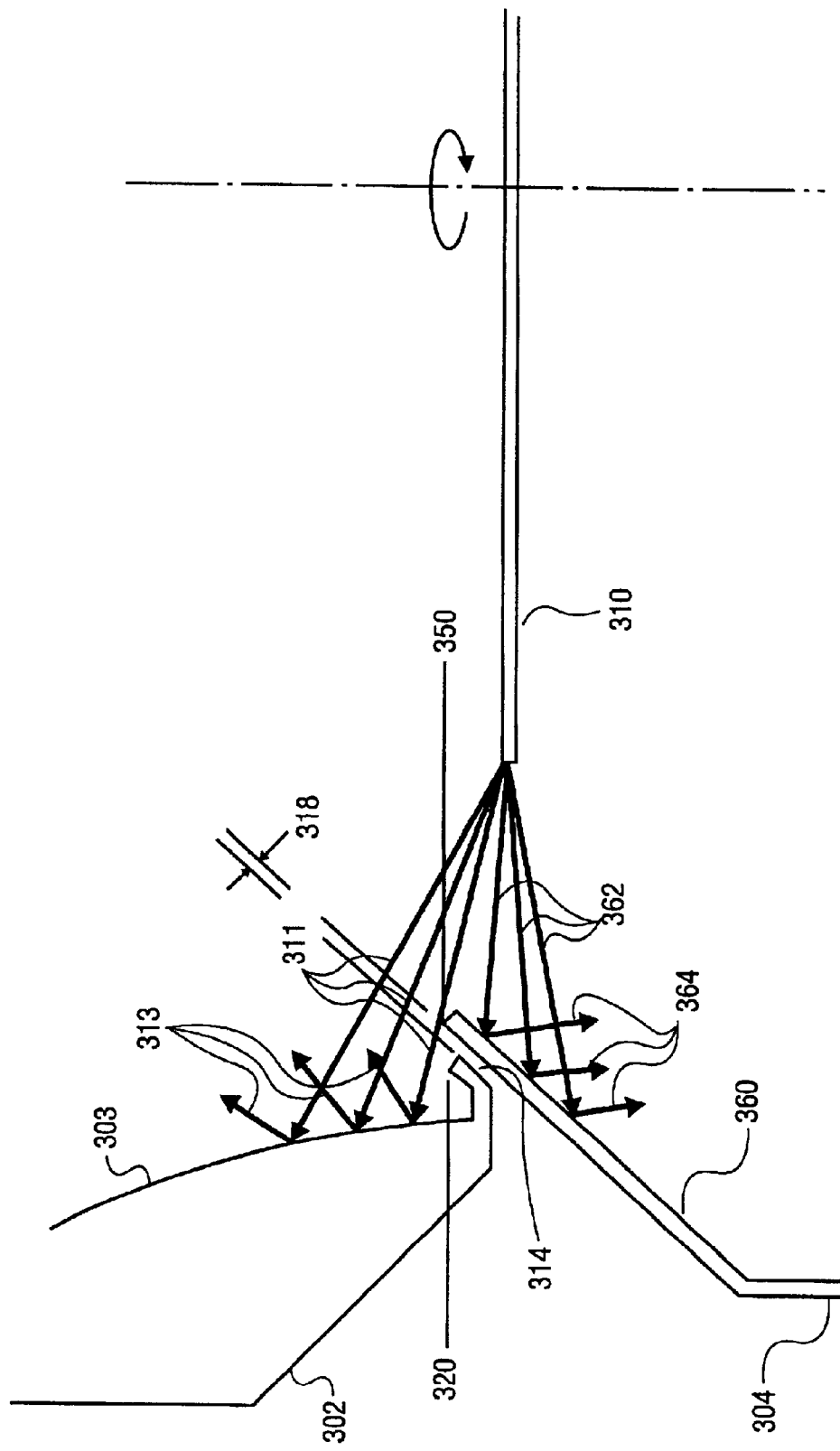
FIG. 3A is an illustration of one embodiment of liquid spray from a rotating wafer reaching a catch cup angled surface that is positioned higher than the gutter.

FIG. 3A is an illustration of one embodiment of the catch cup height equal to or higher than the gutter height. The catch cup 204 is a splash guard capable of shielding one or more surfaces from direct spray from the rotating wafer (FIG. 2A above). By having the catch cup height 350 equal to or higher than the gutter height 320, it will be difficult for spray 311 and 362 leaving the rotating wafer 310 to contact the gutter inboard surface 314. Further, the inboard angled surface 360 of the catch cup 304 can also deflect spray away from returning to the rotating wafer 310. Spray 311 from the rotating wafer 310 can also be deflected 313 away from the wafer 310 by the upper ring 302 presenting a contoured surface 303 to the spray 311. A contoured surface 303 is less likely to bounce 313 the spray 311 back onto the wafer 310. With overall spray bounce-back 311 and 364 to the wafer 310 reduced, the efficiency for removing liquids from the wafer 310 can be improved.

FIG. 3B is an illustration of the effects of wafer spray striking a gutter surface where a catch cup is positioned lower than the gutter. FIG. 3B is not an embodiment of the present invention and shows the unwanted result of spray 384 from a rotating wafer 310 reaching the gutter inboard surface 380. This illustration shows that liquid from the wafer spray 384, not screened by the catch cup 386, can contact the gutter inboard surface 380 and travel down to collect 382 at the bottom end of the upper ring 388. Liquid 382 located at this area of the upper ring 388 can potentially drop onto the wafer 310 during the transfer through the slit 309.

Figure 3C:
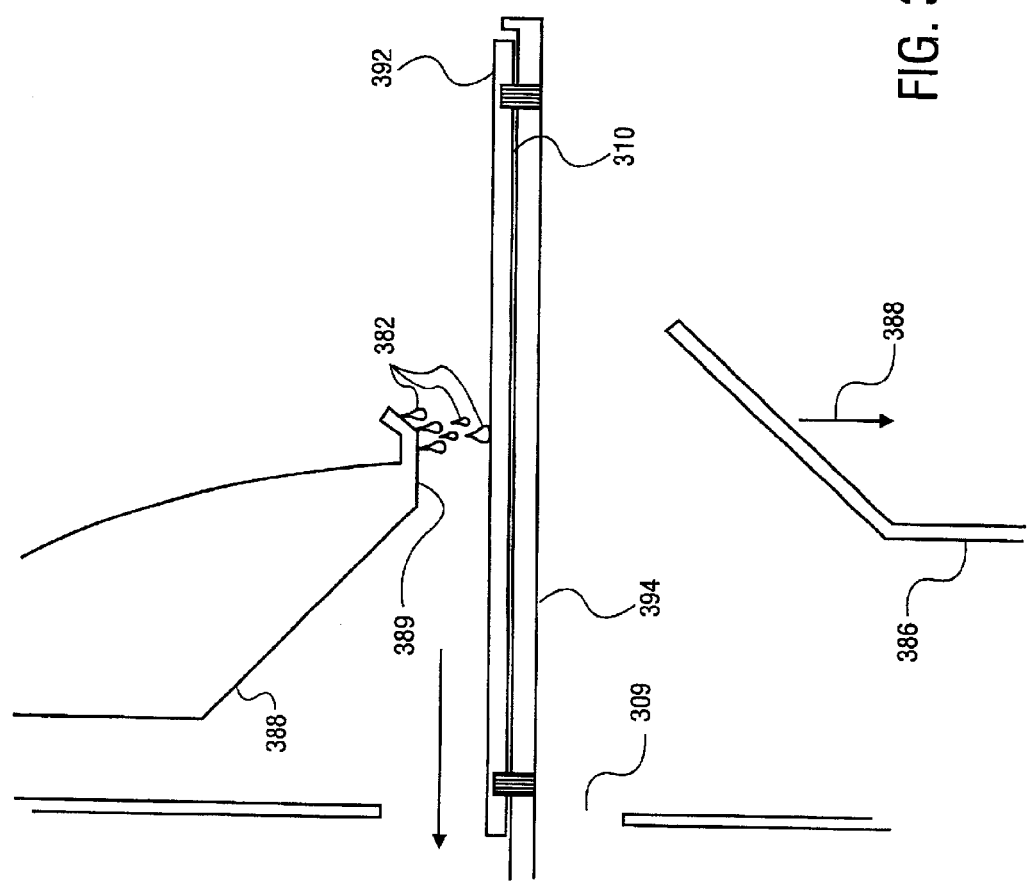
FIG. 3C is an illustration of liquids falling onto the wafer during wafer transfer.

FIG. 3C is an illustration of the effects of removing a wafer after processing where the angled surface was lower than the gutter during processing (FIG. 3B). During a wafer 310 transfer by a robot arm 394 through the slit 309, with the catch cup 386 down 388, liquids 382 that have collected at the bottom 389 of the upper arm 388 can drop onto the wafer 310 to contaminate the wafer top surface 392.

Figure 4A:
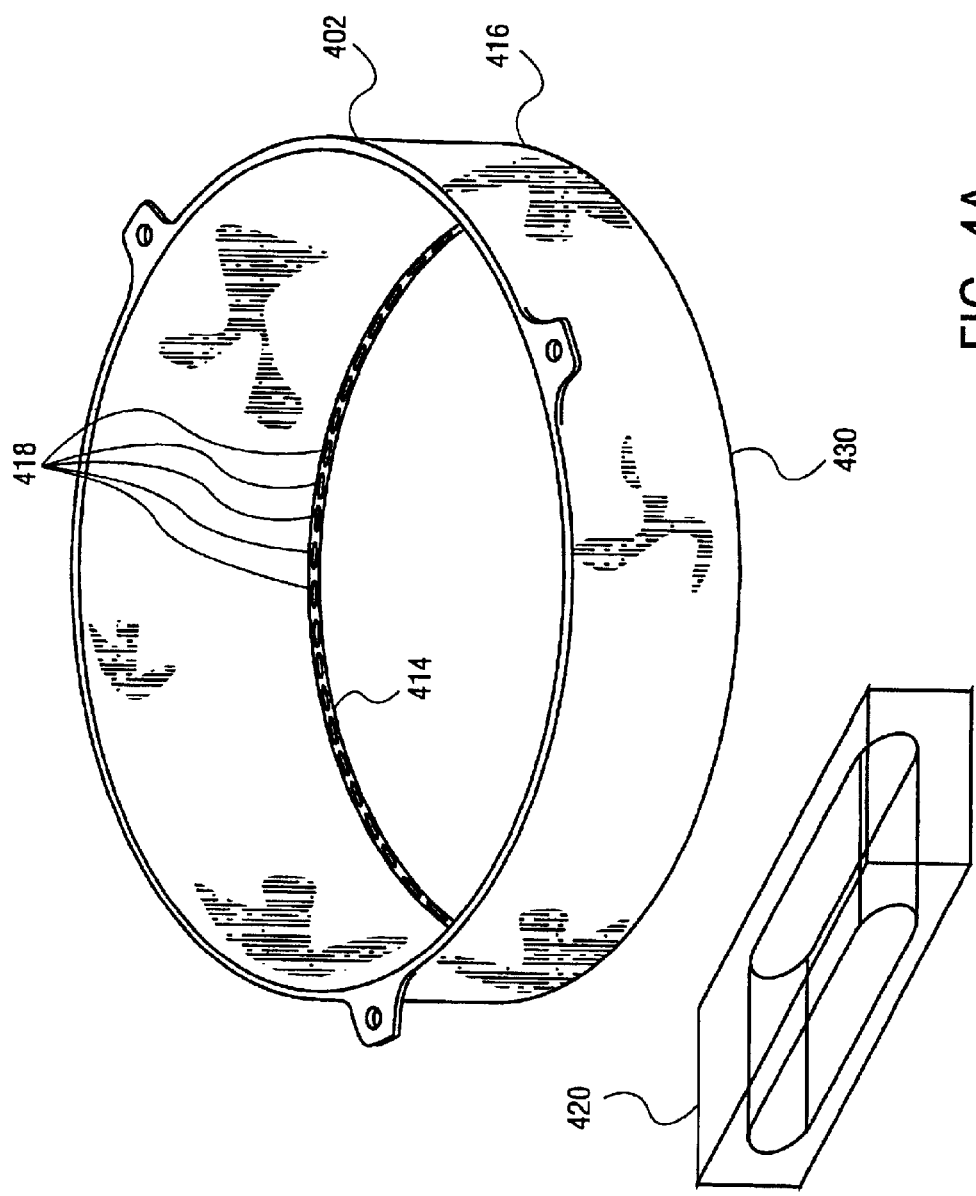
FIG. 4A is an illustration of one embodiment of a 3D representation of an upper arm with a gutter.

FIGS. 4A & 4B are illustrations of one embodiment of an upper ring with a gutter. FIG. 4A is a 3-dimensional illustration of the upper ring. As shown in FIG. 4A, the upper ring 402 has the gutter 414 positioned at the bottom end 416. Visible in the gutter 414 are a series of drains 418 at the bottom or base 428 of the gutter 414 to allow for drainage of liquids (not shown) collected by the gutter 414. Without drainage 418, fluid collected can overflow the gutter 414 and result in liquid flow onto the gutter inboard surface 214 (FIG. 2B) and ultimately onto a wafer during wafer transfer.

FIG. 4B is a top down view of the upper ring and gutter positioned relative to a slit. As shown in FIG. 4B, drains 418 in the gutter 414 can be a series of local slots in the base 428 that run circumferentially with the gutter 414. However the drains 418 are excluded in the gutter at a location 424 that will be adjacent to the slit 420 (shown in phantom for relational purposes only). With no drains 418 placed in the gutter 414 at the area above and around 424 (adjacent) where the wafer (not shown) will transfer through the slit 409, liquid caught in the gutter 414 cannot drain to fall onto the wafer during the transfer.

Figure 5:
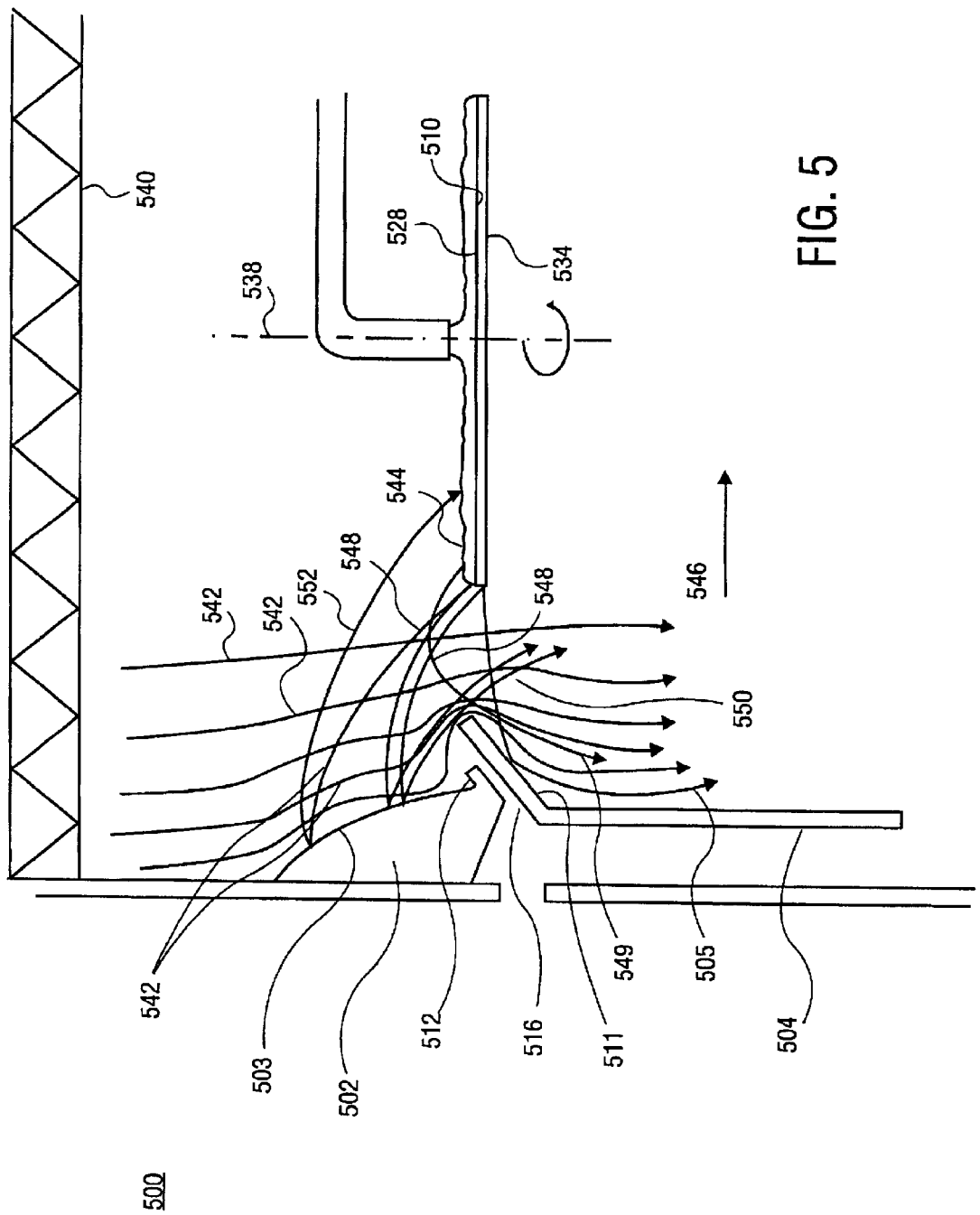
FIG. 5 is an illustration of one embodiment air flow over the upper arm aerodynamic surface and liquid spray from the rotating wafer.

FIG. 5 is an illustration of air flow over the upper ring and catch cup. To ensure processing uniformity, air flow 542 from the filter 540 should be uniform onto the wafer 510 during a wafer cleaning operation. Any form of turbulence, i.e. vortices, in the air flow 542, can potentially create a disruption in the flow of process liquids and gasses across the wafer surface 544, as well as in the spray 548 leaving the rotating wafer 510. The gutter 512 and curved end 516 of the catch cup 504 can potentially stick out into the air flow 542 enough to create vortices (not shown) that can affect process conditions.

To reduce the degree that the gutter 512 and catch cup 504 stick out into and can potentially disrupt air flow 542, an aerodynamic curve 503 in the upper ring 502 can be used to bring the air flow 542 inboard 546 over a distance in a manner that can maintain laminar flow, that is, the inner diameter of the upper arm "necks down" or transitions to a smaller diameter. The aerodynamic curve 503 can neck down the flow 542, i.e. direct the flow 542 inward toward the center 538 of the process chamber 500, and this necking down can deflect air flow around features within the process chamber 500. A shorter gutter 512 and catch cup end 516 sticking out into the air flow 542 can be such features where the shorter gutter 512 and catch cup curved end 516 can reduce or remove the likelihood of creating these vortices.

Laminar flow 542 can add a downward force onto the spray 548 leaving the rotating wafer 510. A result can be that there some of the liquid 549 may not reach the chamber walls 503. Laminar flow 542 can also add the downward force to the spray 550 that is deflected off the walls 503 of the process chamber 500. Another result can be that for liquids 548 that do contact the chamber walls 503, there will be less bounce-back spray 552 onto the wafer 510 whereas, were a vortex to be created, the vortex (not shown) could have the ability to carry spray back onto the wafer 510.

The formation of turbulence in the downward flow of air from the filter can carry liquid spray from a rotating wafer to any and all surfaces within the cleaning chamber, and in particular to surfaces that can drop liquids onto the transferring wafer. Oppositely, a downward laminar flow of air, i.e. without vortices, can limit spray from the rotating wafer from reaching the cleaning chamber interior walls.

In addition, when rinse liquid spray 548 and 549 from the wafer contacts the curvature 503 in the upper ring 502, and the inboard angled surface 517 of the catch cup 504, these curvatures 503 and 517 can act to reduce the amount of rinse liquid splashing back 552 onto the wafer 510. The efficiency of a wafer 510 rotating to remove rinse liquids from the wafer surfaces 528 and 534 can be reduced if the spray leaving the wafer 510 is bounced back 552 onto the wafer 510.

Figure 6:
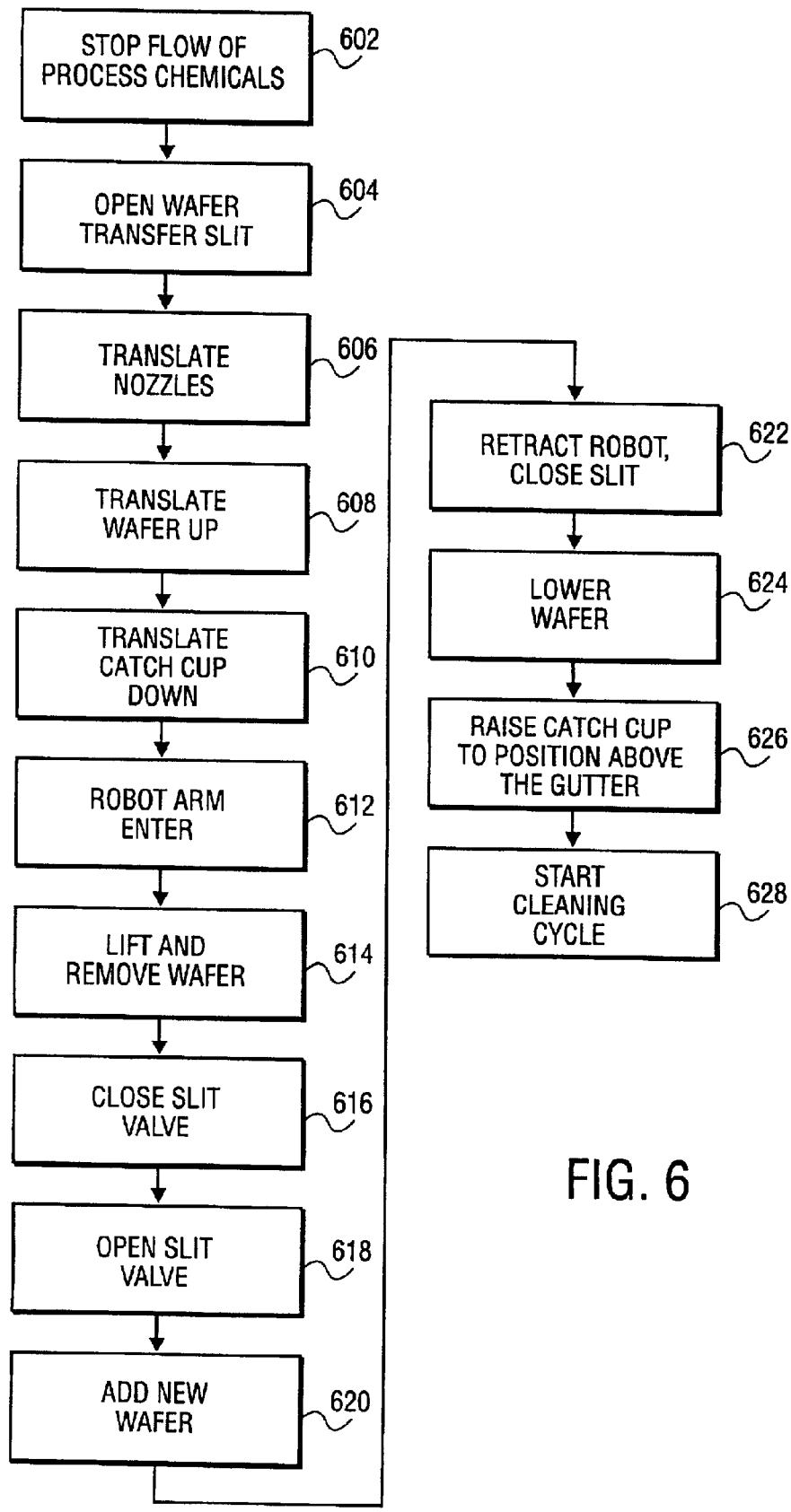
FIG. 6 is a flow diagram of one embodiment of a method for cleaning a wafer.

FIG. 6 is a process diagram of one embodiment of a method of using a single wafer cleaning chamber. Using the present invention, when a single wafer cleaning operation is complete, the single wafer cleaning chamber stops flowing fluids and with the flow of air from the air filter continuing (operation 602). Next a wafer transfer slit valve can open to provide access to and from a wafer transfer slit. (operation 604). A pair of process nozzles can rotate to provide clearance for the wafer bracket to translate up. (operation 606). The wafer bracket can translate the wafer up to the slit valve positioned at mid-level in the single wafer cleaning chamber. (operation 608). The catch cup can translate down to expose the wafer transfer slit. (operation 610). The robot arm can enter the single wafer cleaning chamber to a position beneath the wafer in the bracket. (operation 612). A robot arm can lift and remove the wafer from the bracket. (operation 614) The slit valve can close. (operation 616) The slit valve can then open. (operation 618) From the wafer transfer chamber, the robot arm can place a new wafer into the single wafer cleaning chamber and onto the bracket. (operation 620). The robot arm can be retracted from the single wafer process chamber and the slit valve closed to seal the wafer transfer slit. (operation 622) The bracket can lower the wafer to a process position and the nozzles can translate to a position above the wafer. (operation 624). The catch cup can be raised until a flat angled surface of the catch cup is equal to or above a lip on the gutter and where a gap is created between the lip and the flat angled surface. (operation 626) At this point, a single wafer cleaning operation can commence. (operation 628)

Thus an apparatus and method for improving the efficiency of a single wafer cleaning chamber is described. The method and apparatus described can restrict process chemicals from dropping onto a wafer during mid-level wafer transfer. The method and apparatus further describes limiting liquid spray from a spinning wafer from bouncing back onto the wafer during a process cycle. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A single wafer cleaning chamber, comprising:
    a rotatable bracket capable of positioning a wafer beneath an upper end of a catch cup during a wafer cleaning process;
    a gutter positioned above a wafer transfer slit; and
    the catch cup capable of mating with the gutter to create a gap, wherein the upper end of the catch cup is positioned at a height equal to or higher than the gutter.

2. The apparatus of claim 1, wherein a top section of the catch cup is angled.

3. The apparatus of claim 2, wherein the gap between the gutter surface mating with the catch cup angled surface is larger at the outboard side.

4. The apparatus of claim 3, wherein the narrowest part of the gap is approximately in the range of approximately 1–5 mm.

5. The apparatus of claim 2, wherein the gutter surface where mated with the catch cup surface is parallel.

6. The apparatus of claim 5, wherein the gap is approximately in the range of 1–5 mm.

7. The apparatus of claim 1, further comprising an upper ring having a contoured surface that narrows the opening through the upper ring.

8. The apparatus of claim 7, wherein the surface has an aerodynamic shape that minimizes air flow turbulence.

9. The apparatus of claim 1, wherein the catch cup is capable of being raised and lowered.

10. The apparatus of claim 1, wherein the gutter is 360 degrees around.

11. The apparatus of claim 1, wherein the gutter is a local feature positioned adjacent to the wafer transfer slit.

12. The apparatus of claim 1, further comprising, drain holes in the gutter except where adjacent to the wafer transfer slit.

* * * * *